United States Patent
Ogino et al.

[11] Patent Number: 6,028,364
[45] Date of Patent: Feb. 22, 2000

[54] SEMICONDUCTOR DEVICE HAVING A STRESS RELIEVING MECHANISM

[75] Inventors: Masahiko Ogino; Akira Nagai, both of Hitachi; Shuji Eguchi, Tokai-mura; Toshiaki Ishii, Hitachi; Masanori Segawa, Hitachi; Haruo Akahoshi, Hitachi; Akio Takahashi, Hitachiohta; Takao Miwa, Hitachinaka; Naotaka Tanaka, Chiyoda-machi; Ichirou Anjou, Koganei, all of Japan

[73] Assignee: Hitachi, Ltd., Tokyo, Japan

[21] Appl. No.: 08/809,233

[22] PCT Filed: Apr. 12, 1995

[86] PCT No.: PCT/JP95/00714

§ 371 Date: Mar. 19, 1997

§ 102(e) Date: Mar. 19, 1997

[87] PCT Pub. No.: WO96/09645

PCT Pub. Date: Mar. 28, 1996

[30] Foreign Application Priority Data

Sep. 20, 1994 [JP] Japan .................................. 6-224674

[51] Int. Cl.[7] .......................... H01L 23/48; H01L 23/52; H05K 1/00; H05K 7/20
[52] U.S. Cl. .......................... 257/778; 257/737; 257/738; 257/700; 257/758; 257/668; 257/701; 361/792; 174/255; 174/524
[58] Field of Search .................... 257/706, 737, 257/778, 700, 714, 692, 712, 698, 717, 722, 723, 738, 668, 758, 750, 701; 361/764, 783, 707, 792, 730, 765, 808; 174/256, 255

[56] References Cited

U.S. PATENT DOCUMENTS

Re. 34,887  3/1995  Ushi-fusa et al. ................ 361/795
4,744,007   5/1988  Watari et al. ..................... 361/386
4,825,284   4/1989  Saga et al. ....................... 257/778
5,097,318   3/1992  Tanaka et al. .................... 257/690
5,220,199   6/1993  Owada et al. .................... 257/737
5,281,151   1/1994  Arima et al. ..................... 257/778
5,291,064   3/1994  Kurokawa ........................ 257/714
5,322,593   6/1994  Hasegawa et al. ............... 156/633
5,350,886   9/1994  Miyazaki et al. ................. 174/255
5,550,408   8/1996  Kunitomo et al. ................ 257/737
5,565,706  10/1996  Miura et al. ...................... 257/700
5,615,089   3/1997  Yoneda et al. .................... 361/764
5,635,767   6/1997  Wenzel et al. .................... 257/778
5,861,664   1/1999  Inoue ................................ 257/700

FOREIGN PATENT DOCUMENTS 3-116838  5/1991  Japan .................................. 257/693

Primary Examiner—Alexander Oscar Williams
Attorney, Agent, or Firm—Antonelli, Terry, Stout & Kraus, LLP

[57] ABSTRACT

A semiconductor device has a multi-layered wiring structure having a conductor layer to be electrically connected to a packaging substrate, the structure being provided on a circuit formation surface of a semiconductor chip; and ball-like terminals disposed in a grid array on the surface of the multi-layered wiring structure on the packaging substrate side, wherein the multi-layered wiring structure includes a buffer layer for relieving a thermal stress produced between the semiconductor chip and the packaging substrate, after packaging thereof, and multiple wiring layers. In this semiconductor device, the wiring distance is shorter than that of a conventional semiconductor device, so that an inductance component becomes smaller, to thereby increase the signal speed; the distance between a ground layer and a power supply layer is shortened, to reduce noise produced upon operation, and also a thermal stress upon packaging is relieved by the buffer layer of the multi-layered wiring structure, resulting in the improved connection reliability; and the number of terminals per unit is increased because of elimination of wire bonding.

19 Claims, 6 Drawing Sheets

SEMICONDUCTOR DEVICE HAVING A STRESS RELIEVING MECHANISM

TECHNICAL FIELD

The present invention relates to a semiconductor device of the type used for high density packaging, a multi-chip module, bare chip packaging, and the like, and a packaging structure of the semiconductor device.

BACKGROUND ART

In recent years, the reduced sizes and increased performances of electronic devices have generated a demand for higher integration, higher density, and higher processing speed in the semiconductor devices used for such electronic devices. To meet such a demand, packages for semiconductor devices are being developed from a pin insertion type to a surface packaging type for purposes of increasing the packaging densities thereof, and also developments have been proposed for a DIP (Dual Inline Package) type to a QFP (Quad Flat Package) type and a PGA (Pin Grid Array) type package for coping with the requirements of a multi-pin arrangement.

Of the packages thus developed, the QFP type makes it difficult to cope with a multi-pin arrangement because it is so configured that leads to be connected to a packaging substrate are concentrated only at a peripheral portion of the package when they are also liable to be deformed due to the small diameter thereof. On the other hand, the PGA type has a limitation in that it presents difficulties in coping with both high speed processing and surface packaging because it is so configured that the terminals to be connected to a packaging substrate are elongated and very collectively arranged.

Recently, to solve these problems and to realize a semiconductor device capable of coping with high speed processing, a BGA (Ball Grid Array) package has been disclosed in U.S. Pat. No. 5,148,265, which has ball-like connection terminals over the entire packaging surface of a carrier substrate electrically connected to a semiconductor chip by gold wire bonding. In this package, since the terminals to be connected to a packaging substrate are formed into ball-like shapes, they can be arranged in a dispersed manner over the entire packaging surface without experiencing the deformation of leads as found in the QFP, so that the pitches between the terminals become larger, to thereby make surface packaging easy; and also, since the lengths of the connection terminals are shorter than those of the type package, the an inductance component becomes smaller and thereby the signal transmission speed becomes faster, with a result that such a package is amenable to high speed processing.

In the above-described BGA package, an elastic body is inserted as a component between a semiconductor chip and terminals of a packaging substrate for relieving thermal stress produced due to a difference in thermal expansion between the packaging substrate and the semiconductor chip upon packaging thereof. The semiconductor device having such a structure, however, has problems related to on the use of gold wire bonding for connection with upper electrodes of the semiconductor chip; namely, since the connection portions connected to the gold wires are concentrated only at a peripheral portion of the chip, the structure has an inherent limitation to the increasing future demand for a multi-pin arrangement, and a higher processing speed for the semiconductor devices, and the structure also provides an inconvenience in terms of mass-production and any improvement in production yield because of the increased number of production steps due to the complexity thereof.

Japanese Patent Laid-open No. Hei 5-326625 discloses an improved packaging structure for a flip-chip type package in which a LSI chip having solder bumps is mounted on a multi-layered wiring ceramic substrate having solder bumps, wherein a sealing member is filled between the LSI chip and the multi-layered wiring ceramic substrate as a carrier substrate. The above packaging structure, however, seems to have a problem in terms of higher density interconnection, higher response speed of signals, and miniaturization of the package, because the use of the ceramic substrate as multiple wiring layers makes it difficult to reduce the dielectric constant. Another problem of such a package resides in the production step requiring high temperature burning for the ceramic, and in the difficulties in handling the brittle, thin ceramic substrate.

An object of the present invention is to provide a semiconductor device which is capable of coping with the further increasing future demand for high speed processing and high density packaging, and which is high in its reliability in connection with a packaging substrate; and a further object is to provide a packaging structure for the semiconductor device.

SUMMARY OF THE INVENTION

The gist of the present invention for solving the above-described problems is as follows:

(1) According to the present invention, there is provided a semiconductor device including a multi-layered wiring structure having a conductive layer to be electrically connected to a packaging substrate, the structure having a first side with a surface provided on the surface of a semiconductor chip circuit formation; and ball-like terminals disposed in a grid array on another surface corresponding to a second, opposing side of the multi-layered wiring structure, that is on the packaging substrate (e.g., wiring substrate) side thereof, wherein the multi-layered wiring structure includes a buffer layer for relieving any thermal stress, which may be produced between the semiconductor chip and the packaging substrate after packaging thereof, and multiple wiring layers.

(2) According to the present invention, there is also provided a semiconductor device including a multi-layered wiring structure having a conductive layer to be electrically connected to a packaging substrate, the structure a first side with a surface provided on the surface of a semiconductor chip circuit formation; and ball-like terminals disposed in a grid array on another surface corresponding to a second, opposing side of the multi-layered wiring structure, that is, on the packaging substrate side thereof, wherein an interlayer insulating film in multiple wiring layers for transmitting an electric signal of the multi-layered wiring structure is made of a material for relieving any thermal stress produced between the semiconductor chip and the packaging substrate after packaging thereof.

(3) According to the present invention, there is also provided a packaging structure connected to and mounted on the packaging substrate (e.g., a wiring substrate such as a multi-layer wiring substrate) via the ball-like terminals disposed in a grid array.

The above-described multi-layered wiring structure is required to attain two purposes, i.e. (1) to achieve electric connection between the semiconductor device and a packaging substrate when the semiconductor device is mounted on the packaging substrate; and (2) to relieve a thermal stress produced between the semiconductor device and the packaging substrate upon packaging thereof. Accordingly, the features of the present invention reside in the fact that ① the above multi-layered wiring structure includes two components, that is, multiple wiring layers for transmitting an electric signal and a buffer layer for relieving any thermal stress; or ② an interlayer insulating film in multiple wiring layers for transmitting an electric signal of the multi-layered wiring structure is made of a material for relieving any thermal stress produced between a semiconductor chip and a packaging substrate after packaging thereof, thereby also serving the function of a buffer layer.

The above multi-layered wiring structure is preferably composed of three or more layers including a conductive layer portion having a ground layer, a power supply layer, and a wiring layer. This makes it possible to increase the signal transmission speed and to reduce the occurrence of noise.

Each of the buffer layer and the insulating layer is preferably made of a material having a low dielectric constant. FIG. 1 shows a relationship between the dielectric constant and each of the thickness of the insulating layer and the transmission delay time. In addition, the film thickness h of the insulating layer is given by the following equation [1]. For example, for a wiring having a width w=50 $\mu$m and a height t=30 $\mu$m, the film thickness h at a characteristic impedance $Z_0$=55 $\Omega$ can be calculated by substituting these values in the equation [1].

The delay time Td can be given by substituting a dielectric constant $\in_r$ of the insulating layer in the following equation (2).

$$Z_o = \frac{60}{\sqrt{\varepsilon_r}} \ln\left(\frac{1.9h}{w(0.8 + t/w)}\right) \quad [1]$$

$$Td = 3.34\sqrt{\varepsilon_r} \quad [2]$$

From the result shown in FIG. 1, it becomes apparent that the use of a low dielectric constant material enables thinning of the film thickness h of the insulating layer (that is, thinning of the semiconductor device) and also enables shortening of the delay time (that is, produces increase in response speed). For example, in the case where the insulating layer is made of alumina which is a typical material of a ceramic substrate, since alumina has a dielectric constant of 9.34, the film thickness h of the insulating layer becomes 606 $\mu$m. On the other hand, in the case where the insulating layer is made of polyimide having a dielectric constant of 3.0, the film thickness thereof can be reduced to 180 $\mu$m. With respect to the delay time Td of the insulating layer made of polyimide, it can be shortened by about one-half of that of the insulating layer made of alumina, that is, from 10.2 ns/m to 5.78 ns/m.

The above insulating layer is preferably made of a low thermal expansion polyimide having a linear expansion coefficient of 20 ppm/K or less or a silicon elastomer having a modulus of elasticity of 10 kg/mm$^2$ or less. The use of these materials enables high speed transmission of an electric signal, thinning of the package, and reduction in stress of the package.

Specific examples of the above low thermal expansion polyimide may include a polyimide obtained by polymerization of pyromellitic acid dianhydride and any one of 2,5-diaminotoluene, diaminodurene, benzidine, 3,3'-dimethylbenzidine, 3,3'-dimethoxybenzidine, 4,4'-diaminoterphenyl, 1,5-diaminonaphthalene, and 2,7-diaminofluorene; a polyimide obtained by polymerization of 3,3', 4,4'-benzophenonetetracarboxylic acid dianhydride and any one of 3,3'-dimethylbenzidine, 4,4'-diaminoterphenyl, and 2,7-diaminofluorene; a polyimide obtained by polymerization of 3,3', 4,4'-biphenyltetracarboxylic acid dianhydride and any one of paraphenylenediamine, 2,5-diaminotoluene, benzidine, 3,3'-dimethylbenzidine, 4,4'-diaminoterphenyl, 1,5-diaminonaphthalene, 2,7-diaminofluorene, and 2,5-diaminopyridine.

The present inventors have made an analysis of thermal stress in a semiconductor device upon packaging thereof, and found that body having an elastic modulus of elasticity of 10 kg/mm$^2$ or less enables relief of thermal stress in the semiconductor device without any influence due to the linear expansion coefficient of the elastic body. Accordingly, the object of the present invention can be attained by the use of an elastic body having a modulus of 10 kg/mm$^2$. When the modulus of elasticity of the above elastomer is more than 10 kg/mm$^2$, the elastic body is affected by the linear expansion coefficient thereof, thereby reducing the stress relieving effect of the elastomer.

The elastic body having an elastic modulus of 10 kg/mm$^2$ or less is preferably, made of an elastomer or a low elastic engineering plastic.

Specific examples of the above elastomer may include fluorine rubber, silicon fluoride rubber, acrylic rubber, hydrogenated nitrilo rubber, ethylene propylene rubber, chlorosulfonated polystyrene rubber, epichlorohydrin rubber, butyl rubber, and urethane rubber.

Specific examples of the above low elastic engineering plastic may include polycarbonate (PC)/acrylonitrile butadiene styrene (ABS) alloy, polysiloxanedimethylterephthalate (PCT)/polyethyleneterephthalate (PET), copolymerized polybuthylene terephthalate) (PBT)/polycarbonate (PC) alloy, polytertafluoroethylene (PTFE), florinated ethylene propylene polymer (FET), polyalylate, polyamide (PA)/acrylonitrile butadiene styrene (ABS) alloy, modified epoxy resin, and modified polyolefin resin.

Other than the above plastics, one may use a high molecular material selected from one or two or more kinds of thermosetting resins, such as epoxy resin, unsaturated polyester resin, epoxyisocyanate resin, maleimide resin, maleimide epoxy resin, cyanic acid ester resin, cyanic acid ester epoxy resin, cyanic acid ester maleimide resin, phenol resin, diallyl phthalate resin, urethane resin, cyanamide resin, and maleimide cyanamide resin. Of these high molecular materials, to attain the object of the present invention, a material is preferably used which has such stable hardening characteristics as not to be hardened at room temperature, but is hardened by heating at a temperature of from 150 to 350° C. for a period of from several minutes to several hours. Such a thermosetting resin experiences less thermal deformation at a high temperature and is excellent in heat resistance.

The hardened material thus obtained desirably has a dielectric strength of 10,000 V/cm or more and a heat resistance capable of withstanding a temperature of 150° C. or more for a long period of time.

The above mentioned high molecular material, before being hardened, is preferably or a type which is adjustable as to its viscosity by a solvent, and more preferably, one which exhibits such a photosensitive property as to be hardened by light emission or the like.

The multiple wiring layers of the present invention can be typically realized in accordance with either of the two processes shown in FIGS. 2 and 3.

In the sequential laminating process shown in FIG. 2, the semiconductor of the present invention can be fabricated in accordance with the following steps: first, forming a wiring layer by (step 1) forming an elastomer insulating layer 2 on a semiconductor chip 1, (step 2) forming windows 3 for interlayer connection in the insulating layer 2, and (step 3) forming a wiring layer by performing interlayer connection 4; then, repeating the above steps a number of times, as required for forming the necessary layers, to form multiple wiring layers; and finally, (step 4) forming solder balls 5 as connection terminals to a packaging substrate on the multiple wiring layers.

In the film lamination process shown in FIG. 3, the semiconductor device of the present invention can be fabricated by the following steps: (step 1) sticking wiring sheet-like pieces 6 to each other, (step 2) forming windows 3 for interlayer connection in the laminated sheet-like pieces 6, (step 3) performing interlayer connection 4 to form a multi-layered wiring sheet, (step 4) adhesively bonding the multi-layered wiring sheet on a semiconductor chip via a multi-wire conductor containing buffer layer 7 to form a multi-layered wiring structure, and finally (step 5) forming solder bumps on the multi-layered wiring structure.

The above multi-wire conductor containing buffer layer is prepared, for example, by piecing a polyimide film (thickness: about 50 $\mu$m) adhesively bonded with a copper foil (thickness: about 18 $\mu$m) at specified positions by an excimer laser (KrF: 248 nm, pulse energy: 40 mj/pulse, repeated frequency: 600 Hz at maximum; average output: 24 W), to form holes (diameter: 25 $\mu$m, hole pitch: 40 $\mu$m); burying the holes with a conductive material by plating, such as a known chemical copper plating, followed by etching back of the copper foil; applying nonelectrolytic tin plating on both ends of the conductive material buried in the holes, or by casting (for example, potting) an elastomer into a vessel in which a large number of gold wires are erected at specified positions; and adjusting the thickness of the elastomer containing the gold wires after hardening.

The multi-wire conductor containing buffer layer can be formed of an anisotropic conductive film which has electric conduction only in the vertical direction. A semiconductor chip is superposed on one side surface of the film. At this time, with respect to the film, only portions connected to electrode portions of the semiconductor chip are made electrically conductive. On the other hand, a multi-layered wiring structure having electrodes corresponding to the electrode portions of the semiconductor chip is superposed on the other side surface of the film. At this time, with respect to the film, only portions connected to the electrodes of the multi-layered wiring structure are made electrically conductive.

The multi-wire conductor containing buffer layer is connected to a semiconductor chip by Au/Sn bonding, Sn/Pb bonding, or the like. More specifically, gold is vapor-deposited at electrode portions, to be bonded to each other, of both the chip and buffer layer, followed by forming tin solders thereat by nonelectrolytic tin plating, and in such a state, both the chip and buffer layer are pressed to each other and heated (240–250° C.) for several seconds (2–3 sec), to be thus bonded to each other by melting of the tin solders formed on the electrode portions. The connection of the buffer layer to the multi-layered wiring structure can be performed in the same manner as described above.

The ball-like terminals disposed in a grid array on the connection surface of the multi-layered wiring structure for connection to a packaging substrate may be formed in a ball shape of a solder alloy, containing tin, zinc or lead, or a silver, copper or gold. In this case, such a ball made of the above metal may be covered with gold. By the use of such ball-like terminals, the semiconductor device can be electrically connected to a packaging substrate by melting of the ball-like terminals or by contact or vibration of the ball-like terminals without heating. In addition to the above metals, the ball-like terminal may be formed of an alloy of one kind or two or more kinds of materials selected from molybdenum, nickel, copper, platinum and titanium; or may be formed of multi-layered films having layers made of two or more kinds of material selected from the above metals.

The above semiconductor chip may include a linear IC, LSI, logic, memory, gate array, or the like having circuits formed on a semiconductor substrate.

In accordance with the present invention, the semiconductor device is provided with a heat spreader for assisting heat radiation produced upon operation of the semiconductor chip. The heat spreader is formed of a material which has excellent thermal conductivity, for example, a metal having a high thermal conductivity, such as copper. In particular, the heat spreader is preferably configured to have a structure (see FIG. 7) in which the semiconductor chip 1 is buried and mounted. In the heat spreader having such a structure, a multi-layered wiring structure having an area larger than that of a semiconductor chip can be formed on the heat spreader. The heat spreader having this structure may include heat radiation fins provided on portions other than the chip mounting surface for increasing the entire heat radiation surface area.

The semiconductor device of the present invention may be so configured that two or more semiconductor chips may be mounted on a the single multi-layered wiring structure.

According to the present invention, it is possible to dispose ball-like terminals to be connected to a packaging substrate over the entire packaging surface of the multi-layered wiring structure and to eliminate the necessity of gold wire bonding. As a result, when compared with the conventional semiconductor device, the semiconductor device of the present invention is allowed to easily cope with a multi-pin arrangement, and therefore, it is suitable to higher density and higher integration.

In the semiconductor device of the present invention, since the distance between the ground layer and the power supply layer in the semiconductor substrate can be shortened and also the semiconductor chip can be directly connected to the multi-layered wiring structure without formation of solder bumps, the wiring distance can be shortened as compared with the conventional semiconductor device in which the semiconductor chip and the multi-layered wiring structure are soldered to each other by electrode bumps, with a result that the inductance component can be reduced and thereby the signal transmission speed becomes faster, leading to an increased processing speed of the semiconductor device. Also, in accordance with the present invention, the use of a low dielectric constant material (polyimide, elastomer, or the like) allows the package to be thinned more than that of the conventional package using a multi-layered ceramic substrate, when compared at the same signal frequency.

Additionally, in the present invention, the formation of the multi-layered wiring structure having a low elastic modulus on the semiconductor chip makes it possible to reduce any thermal stress produced between the packaging substrate and the semiconductor chip, and hence the reliability in the connection of the semiconductor chip to the packaging substrate after packaging thereof is improved.

BEST MODE FOR CARRYING OUT THE INVENTION

Hereinafter, the present invention will be described in detail with reference to various examples.

EXAMPLE 1

Figure 1:
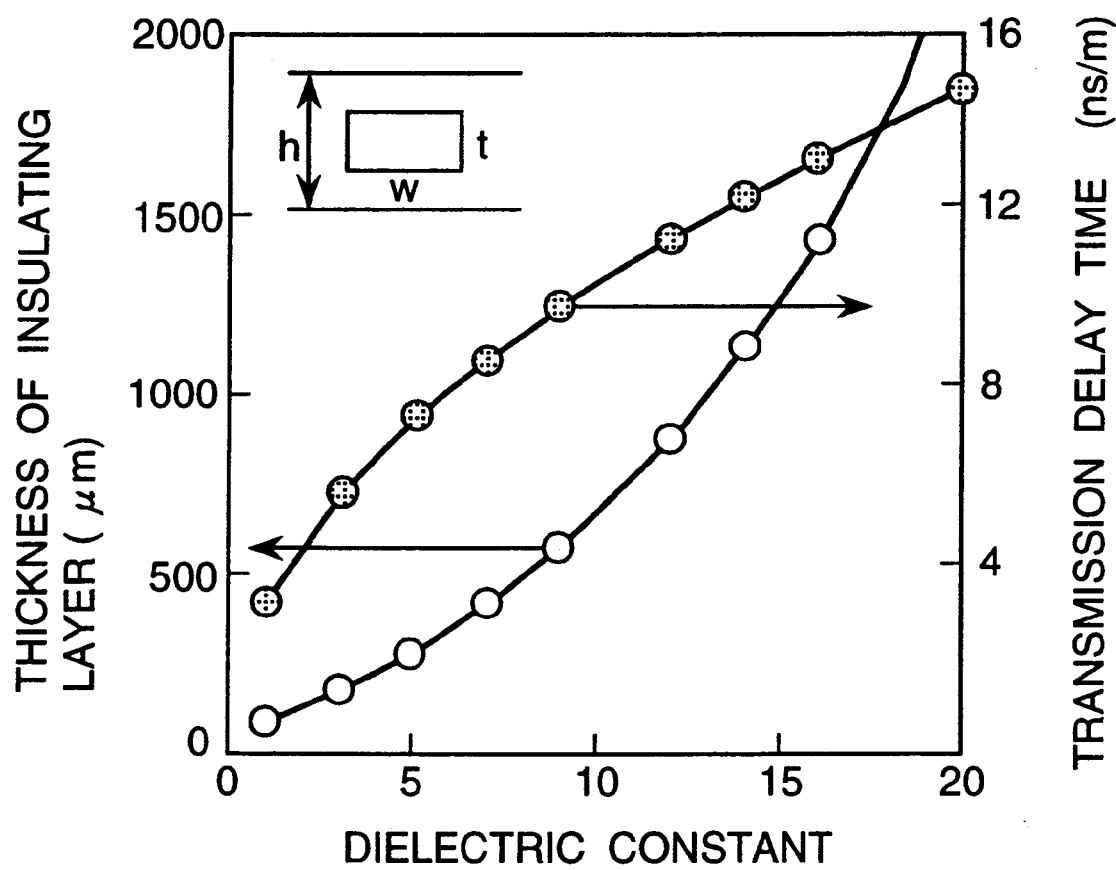
FIG. 1 is a graph showing a relationship between dielectric constant and each of the thickness of an insulating film and the transmission delay time.
Figure 2:
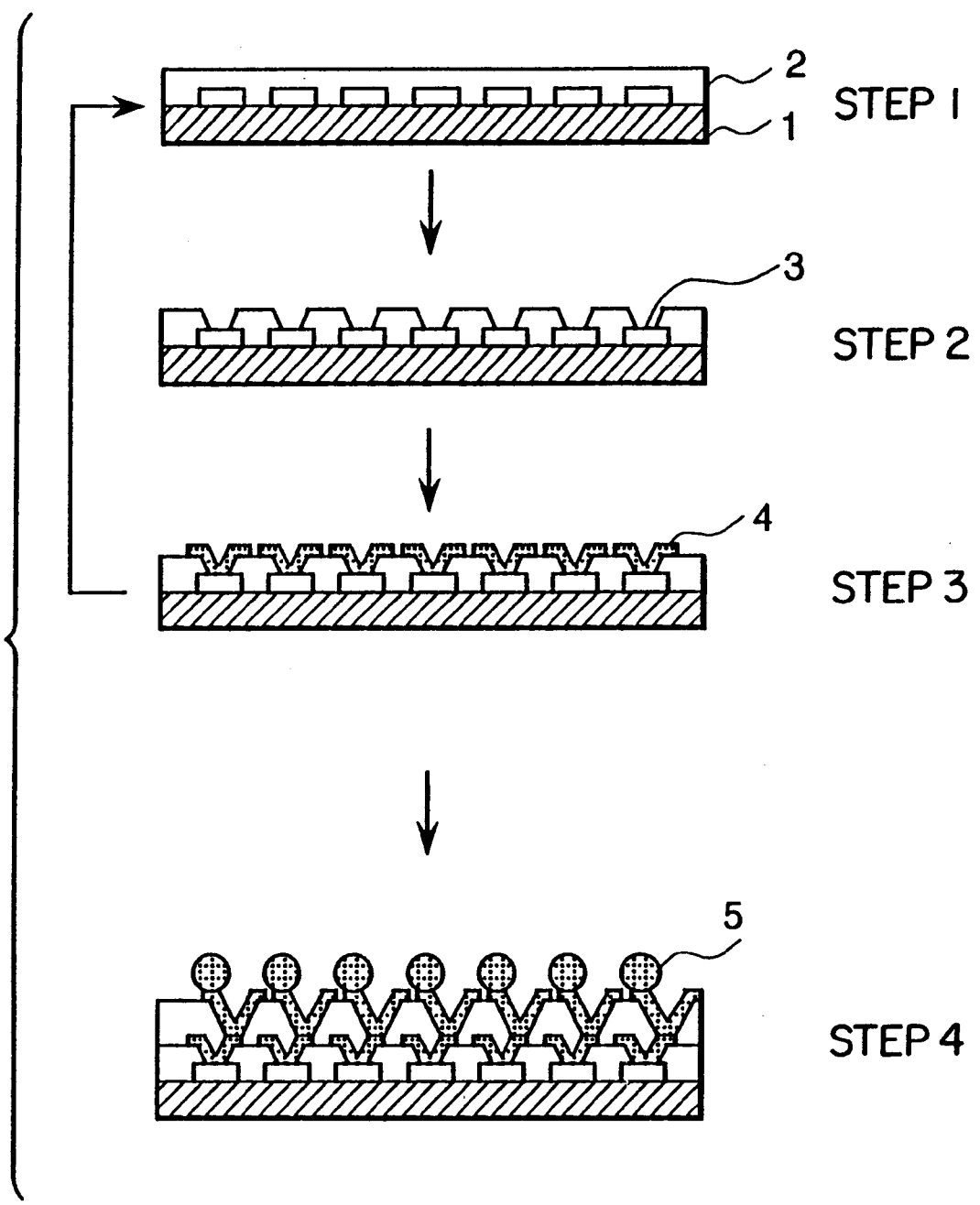
FIG. 2 is a diagrammatic view illustrating fabrication steps for realizing the present invention by a sequential laminating process.
Figure 3:
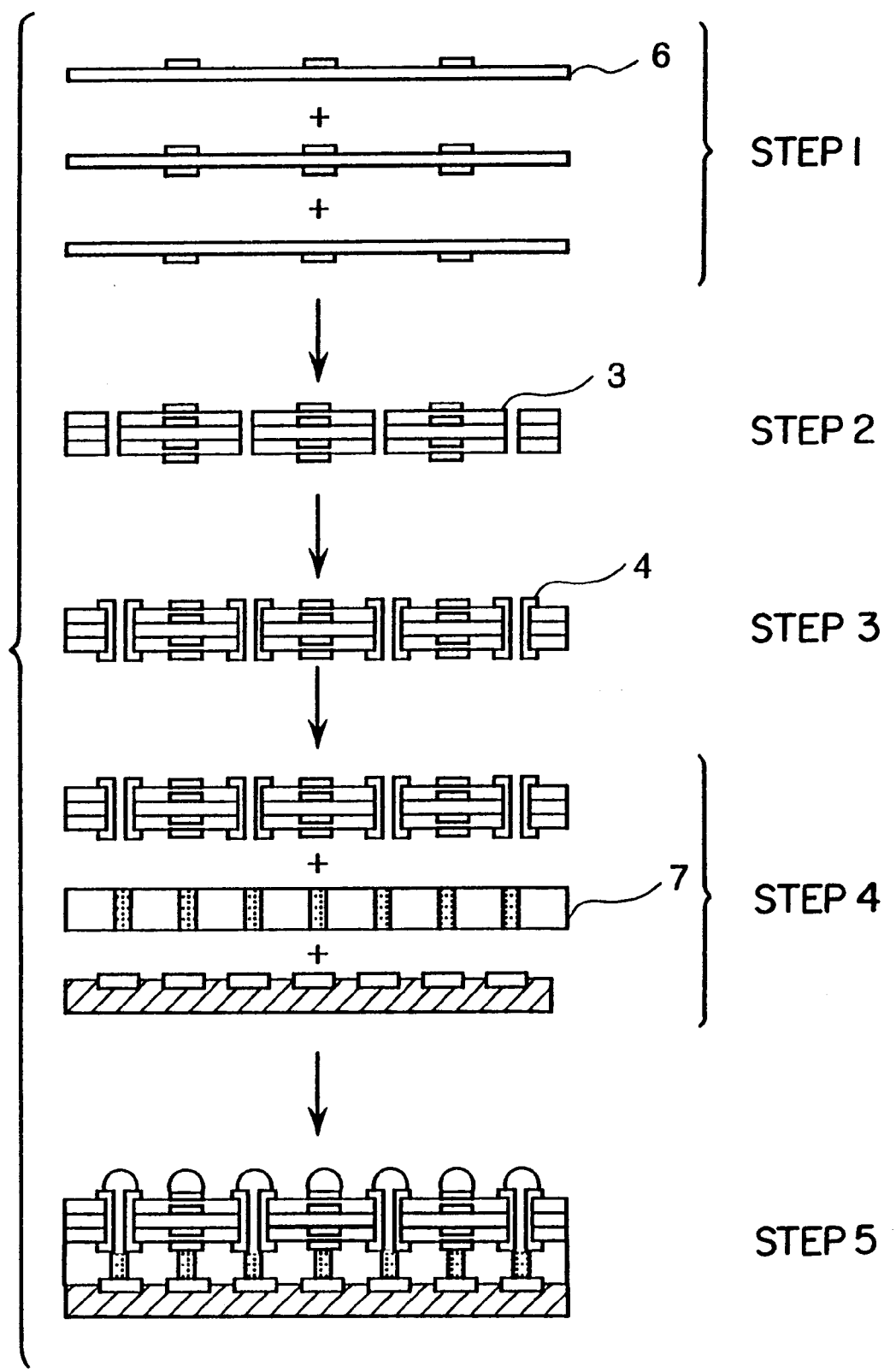
FIG. 3 is a diagrammatic view illustrating fabrication steps for realizing the present invention using a film laminating process.
Figure 4:
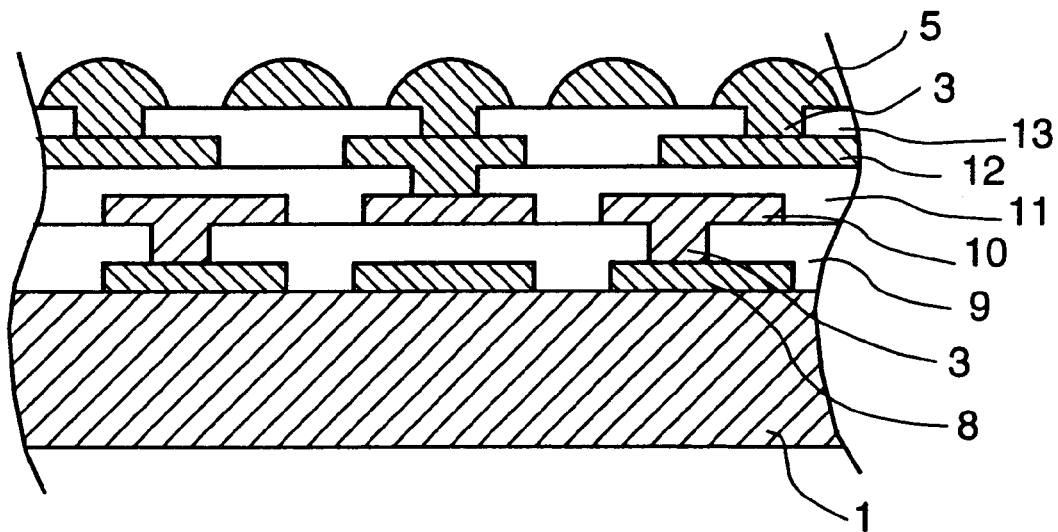
FIG. 4 is a typical sectional view of a semiconductor device according to a first example.

FIG. 4 is a typical sectional view of a semiconductor device according to one example of the present invention. A semiconductor device of the present invention was fabricated by means of the following procedure using a silicon semiconductor chip 1 having elements such as a transistor, diode, resistor, and the like incorporated on a semiconductor substrate.

The upper surface of the semiconductor chip 1 having a single crystal silicon wafer, a silicon layer formed on the silicon wafer by epitaxial growth, and a circuit formed in the epitaxial growth layer, was covered with a protective layer (not shown) formed of a silicon dioxide film, the protective layer being provided with windows for electrical connection.

Next, a first conductive layer 8 made of aluminum was formed on the above-described semiconductor chip 1 in accordance with a specified wiring pattern by a known photoetching process. Subsequently, the substrate was spin-coated with a varnish of polyimide precursor (PIQ, produced by Hitachi Chemical Co., Ltd.) at a rotational speed of from 1,000 to 5,000 rpm, followed by heating in a nitrogen atmosphere at 100° C. for one hour and at 350° C. for 30 minutes to harden the vanish, to thereby form a first insulating film 9 formed of a polyimide film.

The polyimide film was then spin-coated with a negative type liquid resist (OMR-83, produced by TOKYO OHKA KOGYO CO., LTD), followed by hardening at 90° C. for 30 minutes. The resist film thus hardened was then subjected to photoresist patterning, followed by development, and was hardened again in a nitrogen atmosphere at 150° C. for 30 minutes, to thereby form windows in the resist film.

After that, the substrate in such a state was immersed in a mixed solution of hydrazine hydrate and ethylene diamine, to form in the polyimide film windows 3 for interlayer connection, and then the photoresist was separated from the polyimide film by a separating agent composed of an alkali solution (N303C, produced by TOKYO OHKA KOGYO CO., LTD).

After the first insulating film 9 was thus formed, a second conductive layer 10 was formed of Al by vapor-deposition, followed by patterning by the known photoetching process. At this time, the second conductive layer 10 was electrically connected to the first conductive layer 8 through the windows 3 opened at specified positions for interlayer connection.

The above steps were repeated to form a second insulating layer 11 and a third conductive layer 12, and then an uppermost passivation film 13 was formed of a polyimide base resin (PIQ, produced by Hitachi Chemical Co., Ltd) in the same manner as described above, to thus form multiple wiring layers.

Solder balls 5 made of Sn/Pb (63/37), to be electrically connected to a package substrate, were formed in a grid array over the packaging surface of the multiple wiring layers to form a semiconductor device.

Thus, there was obtained a monolithic LSI having multiple wiring layers (a multi-layered wiring structure) formed on the semiconductor chip 1 and also having terminals, to be connected to a packaging substrate, disposed in a grid array on the uppermost surface of the multiple wiring layers.

The monolithic LSI thus obtained was evaluated in terms of temperature cycle testing [one cycle: from (−55° C. /10 min) to (+150° C./10 min)], lead inductance, switching noise, and crosstalk. The results are shown in Table 1.

EXAMPLE 2

Figure 5:
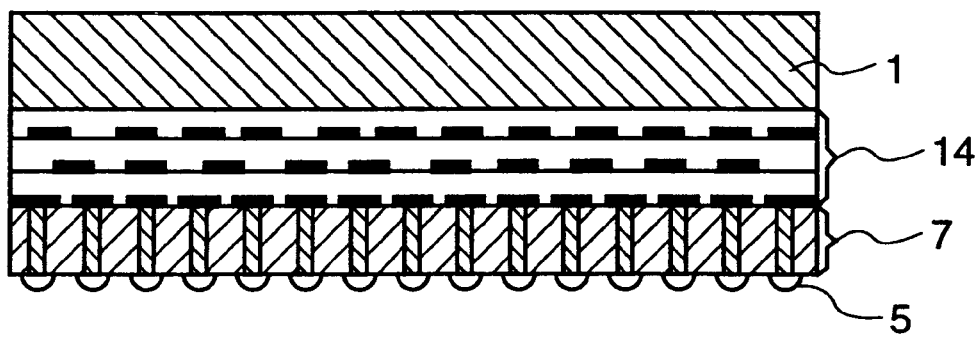
FIG. 5 is a typical sectional view of a semiconductor device according to a second example.

FIG. 5 is a typical sectional view of a semiconductor device according to this example of the present invention, wherein multiple wiring layers 14 and a buffer layer 7 are formed as a multi-layered wiring structure.

First, a copper thin film was formed by sputtering on the surface of a silicon semiconductor chip 1 having multiple wiring layers formed with a circuit and windows for electrical connection. Next, the copper thin film was etched by a specified process to form a wiring. The copper thin film was then stuck with an adhesive sheet formed of a low thermal expansive polyimide film (X952, produced by Hitachi Chemical, Co., Ltd.) applied with an adhesive, followed by hardening the adhesive, and the adhesive sheet was pierced by a laser beam to form specified holes. Via-stads were formed in the specified holes by nonelectrolytic copper plating, and then a copper film was formed on the adhesive film having the holes by sputtering.

The above steps were repeated to form multiple wiring layers 14. A buffer film (ASMAT, produced by NITTO DENKO CORPORATION) as a multi wire conductor containing buffer layer 7 was adhesively bonded via solder on the packaging surface of the multiple wiring layers by pressing and heating, and terminals composed of solder balls 5 made of Sn/Pb (63/37) were connected and formed on the packaging surface side of the buffer layer 7, to thereby obtain a semiconductor device.

The semiconductor device thus obtained was evaluated in terms of temperature cycle testing, lead inductance, switching noise, and crosstalk. The results are shown in Table 1.

A semiconductor device including two semiconductor chips 1 mounted on the multiple wiring layers 14 was similarly fabricated, and this device exhibited the excellent characteristics comparable to those of the semiconductor device having a single semiconductor chip 1.

EXAMPLE 3

Figure 6:
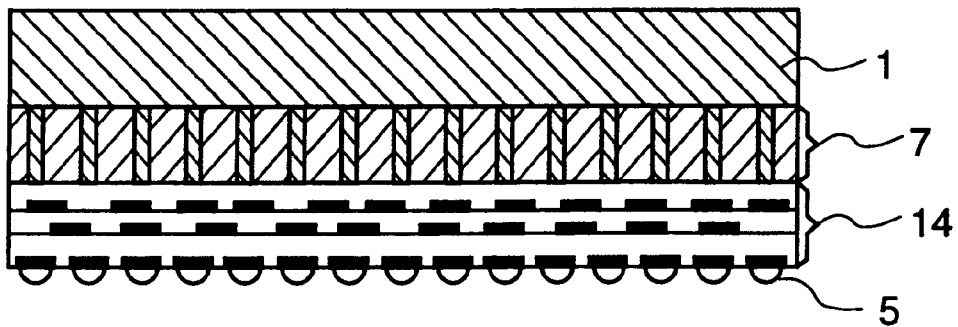
FIG. 6 is a typical sectional view of a semiconductor device according to a third example.

FIG. 6 is a typical sectional view of a semiconductor device according to this example of the present invention, wherein multiple wiring layers 14 are connected to a circuit formation surface of a silicon semiconductor chip 1 via a multi-wire conductor containing buffer layer 7.

A dual side copper-clad laminate (MCLE67, produced by Hitachi Chemical Co., Ltd.) was patterned by etching, and was coated with a permanent resist (Provia 52, produced by Ciba-Geigy Japan Limited), followed by drying, exposure, and development to form photo-via holes, and then the permanent resist was hardened by heating.

Next, the laminate was pieced by drilling to form through-holes, followed by nonelectrolytic copper plating to form a copper layer thereon, and then the copper layer was patterned by etching, to thereby form multiple wiring layers 14. Solder balls 5 were connected in a grid array onto the packaging surface side of the multiple wiring layers 14, and a buffer film (ASMAT, produced by NITTO DENKO CORPORATION) as a multi-wire conductor containing buffer layer 7 was laminated and bonded onto the opposed surface of the multiple wiring layers 14, to thereby obtain a semiconductor device. The semiconductor device was evaluated in terms of temperature cycle testing, lead inductance, switching noise, and crosstalk. The results are shown in Table 1.

EXAMPLE 4

Figure 7:
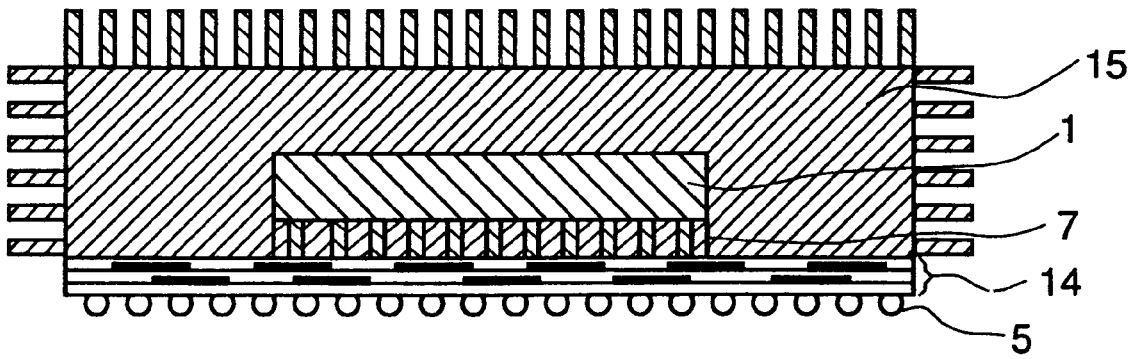
FIG. 7 is a typical sectional view of a semiconductor device according to a fourth example.

FIG. 7 is a typical sectional view of a semiconductor device according to this example of the present invention. A semiconductor chip 1 was buried in a copper heat spreader 15 having heat radiation fins and was fixed thereto by means of a silicon base adhesive, with the circuit formation surface of the semiconductor chip 1 directed toward the packaging side, and a buffer film (ASMAT, produced by NITTO DENKO CORPORATION) in the form of a multi-wire conductor containing buffer layer 7 was similarly buried in the heat spreader 15 and bonded with the circuit formation surface of the semiconductor chip 1. Multiple wiring layers 14 were formed on the packaging surface side of the heat spreader 15 in the following manner.

First, there were prepared two pieces of dual side copper-clad laminates (MCF5000I, produced by Hitachi Chemical Co., Ltd.), in each of which wiring patterns were formed on respective surfaces thereof by a specified etching process. These laminates were adhesively bonded with each other by means of an adhesive (AS2250, produced by Hitachi Chemical Co., Ltd.) and were pierced by a laser beam to form through-holes, followed by electrical connection of these laminates by nonelectrolytic plating via the though-holes, to thereby obtain the multi-layered wiring substrate 14.

Solder balls 5 were connected in a grid array onto the packaging surface side (or wiring substrate side) of the multi-layered wiring substrate 14, to thereby obtain a semiconductor device. The semiconductor device thus obtained was evaluated in terms of temperature cycle testing, lead inductance, switching noise, and crosstalk. The results are shown in Table 1.

EXAMPLE 5

Figure 8:
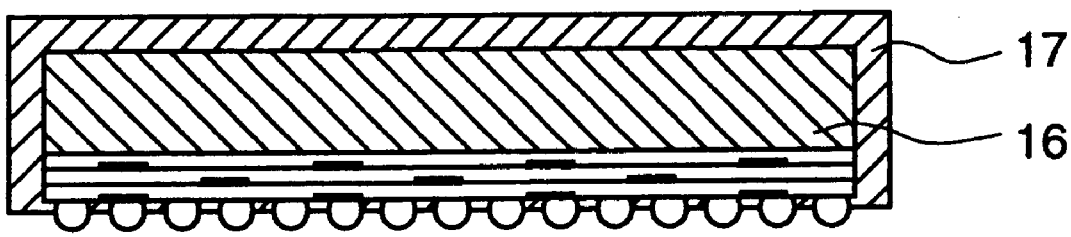
FIG. 8 is a typical sectional view of a semiconductor device according to a fifth example.

The semiconductor device 16 fabricated in the same manner as that in Example 1 was sealed by a transfer molding process using an epoxy resin base mold resin (RM192, produced by Hitachi Chemical Co., Ltd.) as shown in FIG. 8, to obtain a semiconductor device in this example. In addition, the transfer molding condition was as follows:

mold temperature: 180° C.
molding pressure: 7 MPa
transfer time: 15 sec
molding time: 90 sec

EXAMPLE 6

Figure 9:
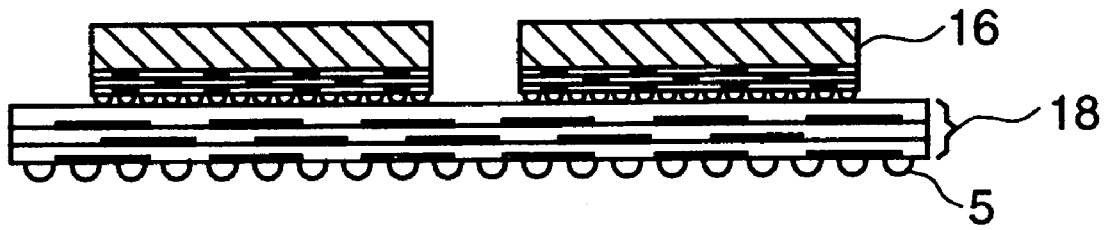
FIG. 9 is a typical sectional view of a semiconductor device according to a sixth example.

As shown in FIG. 9, two members, each corresponding to the semiconductor device 16 fabricated in the same manner as that in Example 1, were electrically connected and mounted on a multi-layered wiring substrate 18 formed in the same manner as that in Example 3, to obtain a multi-chip packaging structure in which solder balls 5 were formed in a grid array on the packaging surface side of the multi-layered wiring substrate 18.

COMPARATIVE EXAMPLE 1

A conventional BGA (Ball Grid Array) type semiconductor device (number of pins: 225, size: 27 mm×27 mm) was evaluated in terms of temperature cycle testing, lead inductance, switching noise, and crosstalk. The results are shown in Table 1.

COMPARATIVE EXAMPLE 2

A conventional QFP (Quad Flat Package) type semiconductor device (number of pins: 208, size: 31 mm×31 mm) was evaluated in terms of temperature cycle testing, lead inductance, switching noise, and crosstalk. The results are shown in Table 1.

When compared with the conventional semiconductor devices, the semiconductor device of the present invention shown in each example did not produce any connection failure during the temperature cycle testing, and was low in inductance, switching noise, and crosstalk per unit length.

TABLE 1

|  | Example | | | | Comparative Example | |
|---|---|---|---|---|---|---|
|  | 1 | 2 | 3 | 4 | 1 | 2 |
| number of terminals per unit area (piece/cm$^2$) | 51 | 51 | 51 | 55 | 31 | 22 |
| temperature cycle testing*  1000 cycle | 0/50 | 0/50 | 0/50 | 0/50 | 1/50 | 2/50 |
| 3000 cycle | 0/50 | 0/50 | 0/50 | 1/50 | 20/50 | 10/50 |
| lead inductance per unit length (nH/mm) | 0.25 | 0.28 | 0.28 | 0.30 | 0.49 | 0.63 |
| switching noise (V) | 0.30 | 0.35 | 0.35 | 10.40 | 0.55 | 0.73 |
| crosstalk (V) | 0.04 | 0.05 | 0.05 | 0.07 | 0.09 | 0.51 |

*number of failures/repeated number of testing

What is claimed is:

1. A semiconductor device comprising:
   a multi-layered wiring structure comprising multiple wiring layers, the wiring structure having a first side with a surface provided on a circuit formation surface of a semiconductor chip; and
   ball-like terminals, which are for electrical connection to a wiring substrate, are disposed in a grid array on another surface corresponding to a second, opposing side of said multi-layered wiring structure,
   wherein said multi-layered wiring structure further comprises a buffer layer with a low elasticity for relieving a thermal stress produced between said semiconductor chip and said wiring substrate after packaging thereof.

2. A semiconductor device comprising:
   a multi-layered wiring structure comprising multiple wiring layers, the wiring structure having a first side with a surface provided on a circuit formation surface of a semiconductor chip; and ball-like terminals, which are for electrical connection to a wiring substrate, are disposed in a grid array on another surface corresponding to a second, opposing side of said multi-layered wiring structure, wherein an interlayer insulating film in said multiple wiring layers for transmitting an electrical signal of said multi-layered wiring structure is made of a material capable with a low elasticity for relieving a thermal stress produced between said semiconductor chip and said wiring substrate after packaging thereof.

3. A semiconductor device according to claim 1, wherein two or more semiconductor chips are provided on one multi-layered wiring structure.

4. A semiconductor device according to claim 1, wherein said multi-layered wiring structure has three or more of conductive layers, and said conductive layers comprise a ground layer, a power supply layer, and a wiring layer.

5. A semiconductor device according to claim 1, wherein said buffer layer comprises an insulator and a plurality of conductors penetrating said insulator, said conductors being formed in the shape of multiple wires projecting in the direction perpendicular to the circuit formation surface of said semiconductor chip, and said insulator being made of a high molecular organic material having a modulus of elasticity of 10 kg/mm$^2$ or less.

6. A semiconductor device according to claim 1, wherein said buffer layer comprises an insulator and a plurality of conductors penetrating said insulator, said conductors being formed in the shape of multiple wires projecting in the direction perpendicular to the circuit formation surface of said semiconductor chip, said insulator being formed of a polyimide insulating film.

7. A semiconductor device according to claim 1, wherein said buffer layer comprises an insulator and a plurality of conductors penetrating said insulator, said conductors being formed in the shape of multiple wires projecting in the direction perpendicular to the circuit formation surface of said semiconductor chip, said insulator being made of a material selected from elastomers and low elastic engineering plastics each having a modulus of elasticity of 10 kg/mm$^2$ or less.

8. A semiconductor device according to claim 1, wherein said buffer layer comprises an insulator and a plurality of conductors penetrating said insulator, said conductors being formed in the shape of multiple wire projecting in the direction perpendicular to the circuit formation surface of said semiconductor chip, said insulator being made of a material selected from silicon base elastomers and fluorine base elastomers, each having a modulus of elasticity of 10 kg/mm$^2$, and a combination thereof.

9. A semiconductor device according to claim 1, wherein said interlayer insulating film in said multiple wiring layers is made of a high molecular organic material having a modulus of elasticity of 10 kg/mm$^2$ or less.

10. A semiconductor device according to claim 1 or 2, wherein said interlayer insulating film in said multiple wiring layers is made of a polyimide insulating film.

11. A semiconductor device according to claim 1, wherein said interlayer insulating film in said multiple wiring layers is made of a material selected from elastomers and low elastic engineering plastics, each having a modulus of elasticity of 10 kg/mm$^2$ or less.

12. A semiconductor device according to claim 1, wherein said interlayer insulating film in said multiple wiring layers is made of a material selected from silicon base elastomers and fluorine base elastomers, each having a modulus of elasticity of 10 kg/mm$^2$ or less, and the combination thereof.

13. A semiconductor device according to claim 1, wherein each said ball-like terminals provided for connection of said multi-layered wiring structure to said packaging substrate are made of a metal material selected from solder alloys containing tin, lead, and zinc; silver; copper; gold; and said metal material covered with gold.

14. A semiconductor device according to claim 1, wherein said semiconductor chip has a heat spreader for heat radiation.

15. A semiconductor device according to claim 14, wherein said heat spreader is so configured that said semiconductor chip or said semiconductor chip connected with said buffer layer is buried in said heat spreader.

16. A packaging structure comprising:

a multi-layered wiring structure comprising multiple wiring layers, the wiring structure having a first side with a surface provided on a circuit formation surface of a semiconductor chip; and ball-like terminals, which are for electrical connection and for mounting on a multi-layer wiring substrate, are disposed in a grid array on another surface corresponding to a second, opposing side of said multi-layered wiring structure, wherein said multi-layered wiring structure further comprises a buffer layer with a low elasticity for relieving a thermal stress produced between said semiconductor chip and the wiring substrate, after packaging thereof.

17. A packaging structure comprising:

a multi-layered wiring structure comprising multiple wiring layers, the wiring structure having a first side with a surface provided on a circuit formation surface of a semiconductor chip; and ball-like terminals, which are for electrical connection and for mounting on a multi-layer wiring substrate, are disposed in a grid array on another surface corresponding to a second, opposing side of said multi-layered wiring structure, wherein an interlayer insulating film in said multiple wiring layers for transmitting an electrical signal of said multi-layered wiring structure is made of a material with a low elasticity for relieving a thermal stress produced between said semiconductor chip and the wiring substrate after packaging thereof.

18. A packaging structure according to claim 16, wherein said buffer layer comprises an insulator and a plurality of conductors penetrating said insulator, said conductors being formed in the shape of multiple wire projecting in the direction perpendicular to the circuit formation surface of said semiconductor chip, said insulator being made of a high molecular organic material having a modulus of elasticity of 10 kg/mm$^2$ or less.

19. A packaging structure according to claim 16, wherein said interlayer insulating film in said multiple wiring layers is made of a high molecular organic material having a modulus of elasticity of 10 kg/mm$^2$ or less.

\* \* \* \* \*